United States Patent [19]

Enke et al.

[11] Patent Number: 4,948,259

[45] Date of Patent: Aug. 14, 1990

[54] METHOD AND APPARATUS FOR MONITORING LAYER EROSION IN A DRY-ETCHING PROCESS

[75] Inventors: Knut Enke, Johannesberg; Ingo Hussla, Hanau; Gerhard Lorenz, Alzenau, all of Fed. Rep. of Germany

[73] Assignee: Leybold Aktiengesellschaft, Fed. Rep. of Germany

[21] Appl. No.: 373,883

[22] Filed: Jun. 30, 1989

[30] Foreign Application Priority Data

Jan. 14, 1989 [DE] Fed. Rep. of Germany ....... 3901017

[51] Int. Cl.$^5$ .............................................. G01B 11/06
[52] U.S. Cl. ...................................... 356/382; 156/626
[58] Field of Search ....................... 356/381, 382, 357; 156/626; 204/192.33; 364/563

[56] References Cited

U.S. PATENT DOCUMENTS

| 4,479,848 | 10/1984 | Otsubo et al. | 156/626 |
| 4,496,425 | 1/1985 | Kuyel | 156/626 |

FOREIGN PATENT DOCUMENTS

| 3019583C2 | 12/1980 | Fed. Rep. of Germany . | |
| 156716 | 9/1982 | German Democratic Rep. . | |
| 3925 | 1/1984 | Japan | 156/626 |
| 192904 | 11/1984 | Japan | 356/381 |
| 86833 | 5/1985 | Japan | 156/626 |

OTHER PUBLICATIONS

"Technologie Hochintegrierter Schaltungen", D. Widmann et al, Springer-Verlag Berlin Heidelberg New York, London, Paris, Tokyo, 1988, pp. 194–201.

Primary Examiner—F. L. Evans
Attorney, Agent, or Firm—Hill, Van Santen, Steadman & Simpson

[57] ABSTRACT

A method and apparatus for monitoring layer erosion in a dry-etching process. The apparatus has a first electrode that is electrically connected to a substrate to be etched, as well as a second electrode that is located above the first electrode. Both electrodes are situated inside a process chamber. An optical photometer is positioned outside of the process chamber and directed onto the substrate in the process chamber. Signals received from the optical photometer are amplified by an electrical circuit and are edited and displayed with a Fourier transformation. The etching process can be automatically interrupted when received periodic signals having essentially constant amplitude and frequency undergo a significant change during the etching process of the upper layer. That is, they are received as signals signficantly deviating from one another, this being identified by the electrical circuit as the passage from one layer to another layer of the substrate during the dry-etching process.

14 Claims, 4 Drawing Sheets

COMPUTER GENERATED FINAL POINT GRAPH

METHOD AND APPARATUS FOR MONITORING LAYER EROSION IN A DRY-ETCHING PROCESS

BACKGROUND OF THE INVENTION

The present invention is directed to a method and apparatus for monitoring layer erosion in a dry-etching process. Such an apparatus has a first electrode that electrically contacts a substrate to be etched, and a second electrode that is located above the first electrode, both electrodes being situated inside a process chamber.

It is known to use emission spectrometers for monitoring layer erosion, whereby the light emission of atoms that are in the layer material to be etched is observed with the emission spectrometer. The disappearance of a signal from the emission spectrometer corresponds to the final point in time of the etching of the layer.

The use of optical reflectometers is also known for etching transparent layers, these optical reflectometers generating a signal that is periodic over time and that exhibits a uniform waveform as long as the etching process is still on-going. When the final point of the etching is reached, the signal of the reflectometer changes either to a constant value or to a periodic signal having a different frequency. The latter is the case when a further transparent layer is located under the layer to be etched, the etching rate for this further transparent layer or second layer having a different value than that of the layer to be etched first. When changing from the first to the second layer, the signal usually exhibits a discontinuity that can be electronically detected. In certain cases, however, this discontinuity can be extremely weak, so that a traditional electrical circuit is not able to unambiguously recognize this discontinuity.

Another situation that frequently occurs is when (for the purpose of structuring, a transparent mask, for example) an exposed and developed photoresist having defined gaps extends over the transparent layer that is to be etched. In this case, it is not only the layer to be etched that is eroded at the gaps in the mask, but it is also the mask parts that are eroded. The rates at which the layer and mask become thinner during the etching process usually differ from one another, so that the signal of the photometer represents the superimposition of two different interference systems. This means that the sum of two sine wave type signals having different frequencies and amplitudes occurs in a first approximation. This somewhat more complicated signal waveform likewise changes when the layer to be etched has been completely etched. The sine wave type signal of the mask then remains and a new signal of a further transparent layer laying under the layer that has been completely etched appears. Finding that point in time in this confusion of mutually superimposing, wave-shaped signals at which one of two subsignals disappears and a further one appears is not only an extremely difficult situation to resolve for the operator of an etching apparatus, but in many instances is simply impossible to resolve.

SUMMARY OF THE INVENTION

An object of the present invention is to provide a method and apparatus that provides a signal to a plasma etching machine that shuts the etching process off precisely when the process of etching through a layer has been concluded.

In accordance with the present invention, this object is achieved by an optical photometer located outside of the process chamber and aligned onto the substrate in the process chamber whose signals are amplified by an electrical circuit and can be edited and displayed by way of a Fourier transformation.

Expediently, the transparent layers applied on the substrate can be recognized by the photometer, whereby the periodic signals received during the etching process of the upper layers that are essentially constant in amplitude and frequency can be registered and compared by the electrical circuit. The point in time at which the amplitude and frequency of the received signals change relative to one another is identified by the electrical circuit and displayed as a passage from one layer to the other layer.

The reception of signals that differ from previously received signals in view of wavelength and/or frequency can be processed via a Fourier transformation program such that the point in time of passage through the layer to be etched can be identified.

Advantageously, the signals received in chronologically short succession from the photometer by means of an electrical circuit represent the progression of the etching process and are depicted on a data plotter. The program required for this purpose in a first calculating step, stores a plurality of data points read by the photometer in the electrical circuit up to a prescribed point in time, so that the amplitude of a frequency is obtained via a Fourier transformation. In a second calculating step, the plurality of data is reduced by one point and a second Fourier transformation is carried out. In a third calculating step, the plurality of data points is incremented by a further point and a third Fourier transformation is carried out. In a fourth calculating step, the frequency of the maximum amplitude is identified by the program. In a fifth calculating step, a further data point is added to those already recorded and the data point that was stored first is simultaneously eliminated, whereupon a frequency search is carried out with this data set that has been moved forward by one data point on the time axis, i.e. a time window that progresses in the direction of the time axis is placed over the reflection curve with respect to the data acquisition. Finally, in a sixth step, the amplitude change that indicates the change of the short-wave or high frequency signal into a long-wave or low frequency signal is identified and the final point curves are thus identified.

The apparatus for the implementation of the method has at least one measuring light source together with an associated receiver, for example a photometer, and has an electrical circuit for editing the receiver signals which are fashioned such that the opto-mechanical part of the photometer is located outside of the process chamber and above a glazed, pressure-tight opening. The light beam of the light source or radiation generator of the photometer is incident on the substrate through the glazed opening and is reflected by the substrate onto the associated radiation receiver that is also located outside of the process chamber. A separate, glazed and pressure-tight opening can also be used for receiving the reflected light beam.

In order for the light beam of the radiation generator to reach the substrate unimpeded, a second electrode located above the substrate has an opening or aperture for the passage of the light beam of the photometer. The present invention has a great variety of possible embodiments; one of these is shown in purely schematic fashion in the attached drawings.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
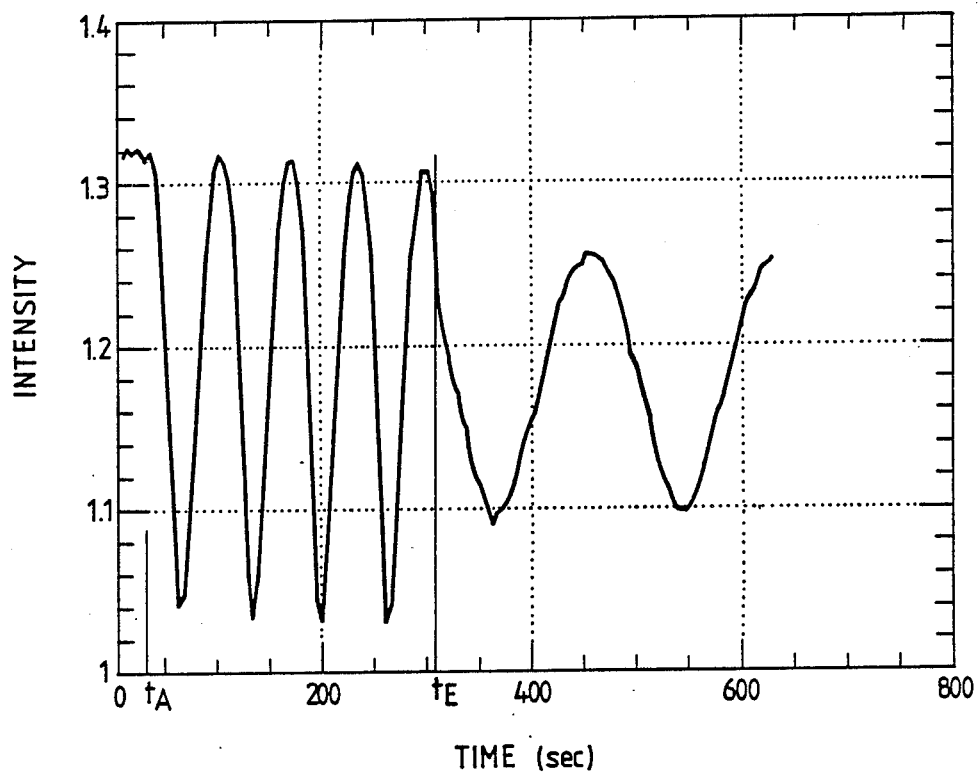
FIG. 1 is a graph of a signal of a reflectometer used in the system.

FIG. 1 shows the signal of a reflectometer (for example, a photometer of the type OMS 1000/2 of Leybold AG) as a function of time, and as recorded by a potentiometric recorder during the etching of a transparent layer that lies over a layer that is likewise transparent in a dry-etching process.

A potentiometric recorder is started at the point in time "zero". The etching process begins at time $t_A$. A periodic signal that is similar to a sine wave oscillation may be seen over the period of time, $t_A$ to $t_E$. This signal is nearly constant in amplitude and frequency up to time $t_E$, the signal then suddenly changes into a different signal that is lower in amplitude and also lower in frequency in the illustrated example.

The two sine wave type oscillations that differ in frequency arise in that the lower layer is shielded from the etching process by the upper layer while the upper layer is being etched and thus does not change in thickness. When the upper layer has been removed by the etching, the lower layer also begins to become thinner, usually at a slower rate. This is expressed as a longer wavelength or a lower frequency of the photometer signal. The function of the Fourier transformation program is to identify the time $t_E$ as exactly as possible. This arithmetic program receives data from the photometer for processing. The data points must follow one another in such short chronological succession that the course of the curve (referred to as a reflection curve) of the signal to be processed can be unambiguously reconstructed from them. This means that at least two data points must lie within a time span between two maximums or minimums of the curve. The arithmetic program (for example, using a computer of type AT 03 of IBM) is controlled such that it first successively stores a plurality of data points up to a time that is prescribed by the operator. The program then executes the Fourier transformation, so that the amplitude of one frequency is obtained.

One feature of the Fourier transformation is that a frequency resolution of the spectrum obtained is dependent on the plurality of data points taken in a defined time interval. At the first pass of the Fourier transformation the exact frequency of the periodic signal is not obtained. It is therefore necessary to first reduce the plurality of data points by one point, to execute a further Fourier transformation, to then increase the plurality of data points by a further point, to likewise carry out a Fourier transformation. Finally the program seeks that frequency at which the amplitude is maximum. The frequency obtained in this way is then considered the "true" frequency that was sought.

The next step of the program is to add a further data point and to omit the first data point. The frequency search is again undertaken with this data set that has been moved forward by one data point on the time axis. This means that a time window that progresses in the direction of the time axis is placed over the reflection curve with respect to the acquisition of data. As long as the signal does not change in structure, i.e. in frequency, a nearly constant numerical sequence will appear at the end of the frequency search portion of the computer program. At the moment, however, at which the short-wave signal changes into a long-wave signal, the amplitude as output by the Fourier transformation program changes.

Figure 2:
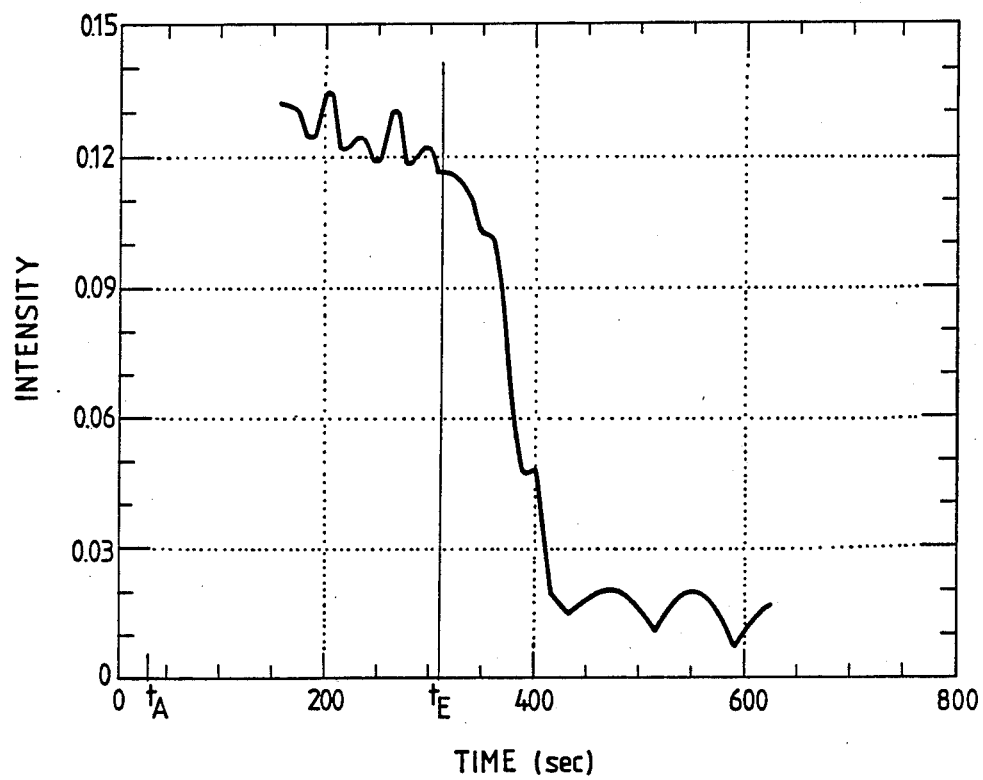
FIG. 2 is a graph of a final point curve.

FIG. 2 shows the final point curve acquired in this manner. Since the time window can not be selected arbitrarily narrow for the reasons initially cited, the transition of the data points at time $t_E$ does not occur abruptly with respect to the frequency output by the program but occurs with a chronological transition that corresponds to the width of the time window.

However, this continuous transition of one signal into another can be tolerated since the advantage of this method is greater certainty over other prior art methods. A further portion of the computer program has been designed such that a signal that serves the purpose of shutting the etching process off is output when a defined, prescribed deviation from the identified frequency is upwardly or downwardly transgressed. For example, this can be of such a nature that the transmitter of the etching machine that controls the etching process is turned off.

Figure 3:
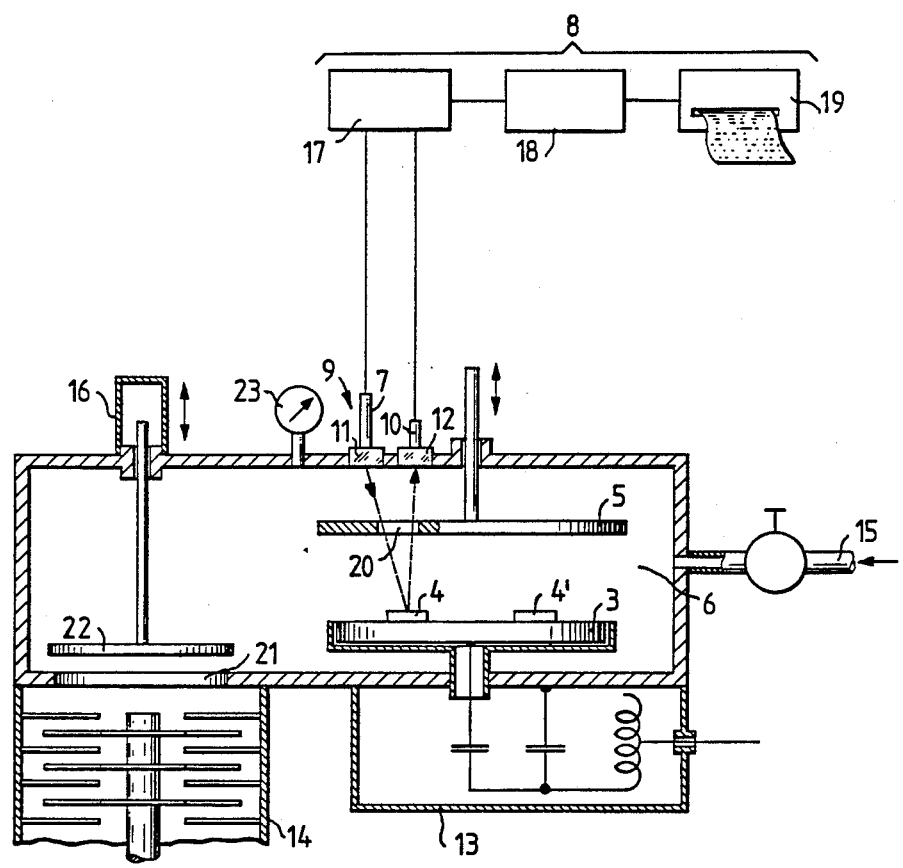
FIG. 3 is a schematic illustration of a system for implementing the method of the present invention.

An apparatus for monitoring the layer erosion during a dry-etching process is schematically shown in FIG. 3 and is essentially composed of a process chamber 6 closed on all sides that is connected to a turbo pump 14. A connecting sleeve 21 between the process chamber 6 and the turbo pump 14 can be closed by the well body 22 of a high-vacuum valve 16. The apparatus also has a process gas admission 15 and a first electrode (cathode) 3 on which substrates 4, 4' can be deposited and that is electrically connected to a matching network 13. A second electrode (anode) 5 is provided whose spacing from the first electrode 3 is variable. A pressure gauge 23, an opto-mechanical part of the photometer 9 composed of a measuring light source 7 and a measuring light receiver 10, and, finally, an electronic device 17 of the photometer 9, a computer 18 and a data plotter 19 are included in the apparatus. A process of sputter etching is carried out in the chamber 6. The substrates 4, 4' are placed onto the cathode 3 and are eroded or etched by ion bombardment. Radio frequency sputtering units are usually employed for this purpose. This technology provides for exact etching of extremely fine contours. However, it can also be used for cleaning the substrates 4, 4'. The electrical circuit 8, composed of electronic device 17, computer 18 and data plotter 19, amplifies the signals of the photometer 9, the signals being edited and displayed by means of the Fourier transformation.

Figure 4:
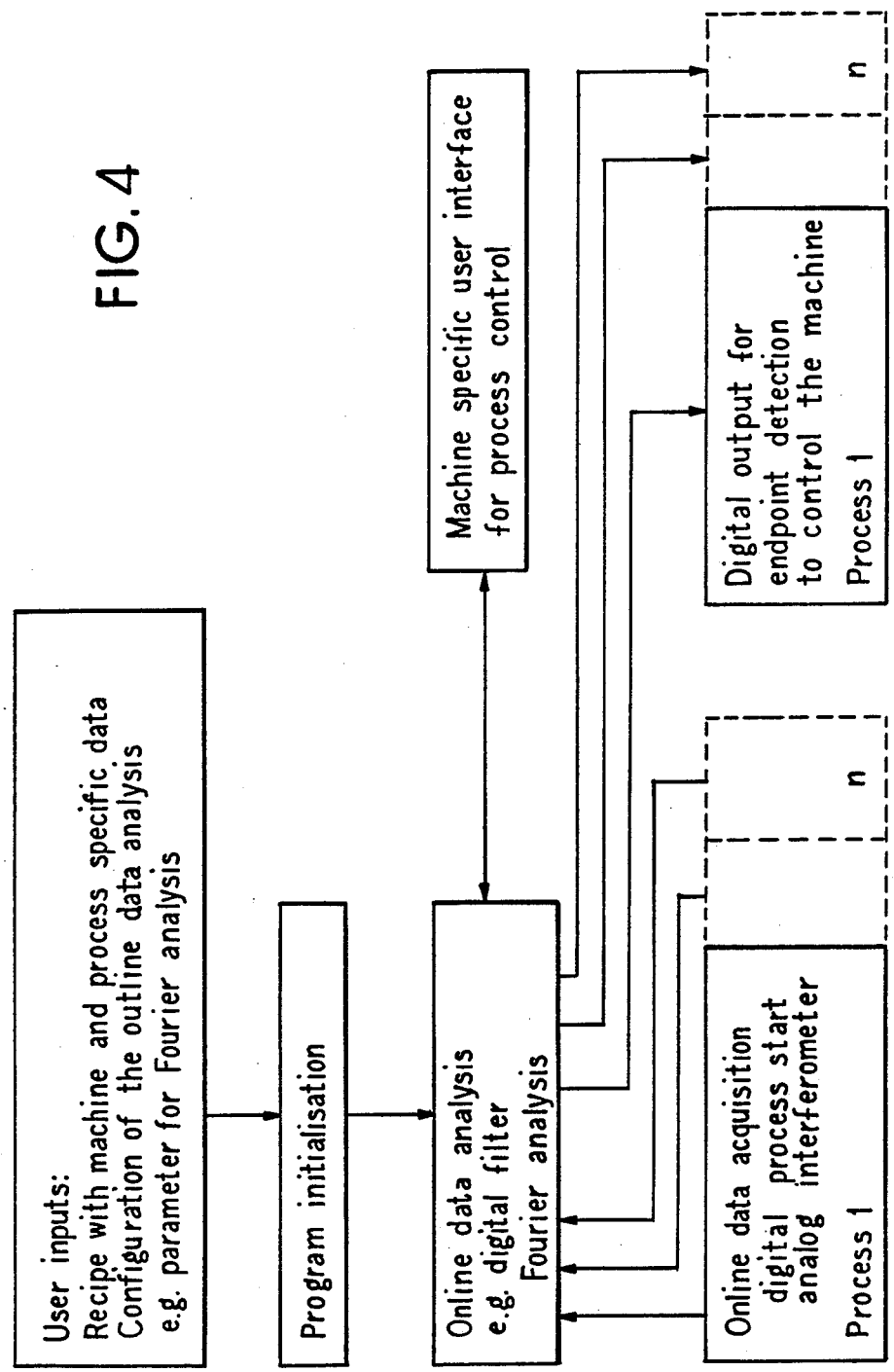
FIG. 4 is a flow chart depicting the programming of a computer for performing calculations in the method of the present invention.

A flow chart of the computer program used to implement the method of the present invention is depicted in FIG. 4. It can be appreciated that other computer programs can be designed which perform the steps of the inventive method including the Fourier transformation calculations.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for monitoring layer erosion of layers on at least one substrate in a dry-etching process, having a first electrode that electrically contacts the substrate to be etched and a second electrode that is located above the first electrode, both electrodes being situated inside a process chamber, comprising the steps of: placing an optical photometer outside of the process chamber and reflecting a light beam off of the substrate in the process chamber by means of the photometer, signals output by the optical photometer being amplified by an electrical circuit and being edited and displayed by means of a Fourier transformation.

2. The method according to claim 1, wherein at least two transparent layers, an upper layer and a lower layer, applied over the substrate can be detected by the photometer, whereby periodic signals that are essentially constant in amplitude and frequency are received during the etching process of the upper layer and registered and compared by the electrical circuit, whereby a point in time at which the received periodic signals deviate greatly in terms of amplitude and frequency from the received periodic signals recorded before this point in time is recognized by the electrical circuit as the passage from the upper layer to the lower layer and is displayed.

3. The method according to claim 2, wherein the reception of the periodic signals that deviate in terms of wavelength and/or frequency from previously received periodic signals can be processed by the electrical circuit via a Fourier transformation program such that a point in time of the passage through the layer to be etched is identified.

4. The method according to claim 1, wherein signals received in chronologically short succession by the photometer with the use of the electrical circuit represent the progression of the dry-etching process as a reflection curve on a data plotter in the electrical circuit, whereby a program necessary for this purpose;

in a first calculating step, stores a plurality of data points read by the photometer in the electrical circuit up to a prescribed point in time, so that the amplitude of one frequency is obtained via a Fourier transformation calculation;

in a second calculating step, reduces the plurality of data points by one point and a second Fourier transformation is carried out;

in a third calculating step, increments the plurality of data points by a further data point and a third Fourier transformation is carried out;

in a fourth calculating step, identifies the frequency with the maximum amplitude;

in a fifth calculating step, adds a further data point to those data points already recorded and the data point that was stored first is simultaneously eliminated, whereupon a frequency search is carried out with this data point set that has advanced by one data point on the time axis, that is, a time window that progresses in the direction of the time axis is placed over the reflection curve with respect to the acquisition of the data point; and in a sixth calculating step, an amplitude change that indicates a transition of a short-wave signal of the periodic signals into a long-wave signal received from said optical photometer is identified and final point curves representative of the amplitude change are formed.

5. An apparatus for monitoring layer erosion of layers on at least one substrate in a dry-etching process, having a first electrode that electrically contacts the substrate to be etched and a second electrode that is located above the first electrode, both electrodes being situated inside a process chamber, an optical photometer being outside of the process chamber and reflecting a light beam off of the substrate in the process chamber, signals representative of the reflected light beam and output by the optical photometer being amplified and being edited and displayed by means of a Fourier transformation, the optical photometer having at least one measuring light source for producing the light beam with an associated receiver for receiving the reflected light beam, and an electrical circuit for processing of the signals from the associated receiver, comprising the measuring light source located outside of the process chamber and above a first glazed, pressuretight opening in the process chamber, the measuring light source directing the light beam onto the substrate which is reflected by the substrate onto the associated receiver, the associated receiver also being located outside of the process chamber.

6. The apparatus according to claim 5, wherein the second electrode located above the substrate has an aperture for the passage of the light beam of the measuring light source.

7. The apparatus according to claim 5, wherein the associated receiver is located above the first opening.

8. The apparatus according to claim 5, wherein the associated receiver is located above a second separate glazed, pressure-tight opening in the process chamber.

9. A method for monitoring layer erosion of layers on at least one substrate in a dry-etching process, having a first electrode that electrically contacts the substrate to be etched and a second electrode that is located above the first electrode, both electrodes being situated inside a process chamber, comprising the steps of:

in a first preliminary step placing an optical photometer outside of the process chamber and reflecting a light beam off of the substrate in the process chamber by means of the photometer, signals output by the optical photometer being amplified by an electrical circuit and said signals being received in chronologically short succession by the electrical circuit and thereby form a reflection curve;

in a first calculating step, storing a plurality of data points from the signals read by the photometer in the electrical circuit up to a prescribed point in time, an amplitude of one frequency being obtained via a Fourier transformation calculation;

in a second calculating step, reducing the plurality of data points by one point and a second Fourier transformation being carried out;

in a third calculating step, incrementing the plurality of data points by a further data point and a third Fourier transformation being carried out;

in a fourth calculating step, identifying the frequency with the maximum amplitude;

in a fifth calculating step, adding a further data point to those data points already recorded and the data point that was stored first being simultaneously eliminated, whereupon a frequency search is carried out with this data point set that has advanced by one data point on the time axis, that is, a time window that progresses in the direction of the time axis is placed over the reflection curve with respect to the acquisition of the data points; and in a sixth calculating step, identifying an amplitude change that indicates a transition of a shortwave signal of the signals into a long-wave signal of the signals and forming a final point curve representative of the amplitude change.

10. The method according to claim 9, wherein at least two transparent layers, an upper layer and a lower layer, applied over the substrate can be detected by the photometer, whereby the signals are periodic signals that are essentially constant in amplitude and frequency and are received during the etching process of the upper layer and registered and compared by the electrical circuit, whereby a point in time at which the received periodic signals deviate greatly in terms of amplitude and frequency from the received periodic signals recorded before this point in time is recognized by the electrical circuit as the passage from the upper layer to the lower layer and is displayed.

11. The method according to claim 9, wherein the signals are periodic signals and wherein the reception of the periodic signals that deviate in terms of wavelength and/or frequency from previously received periodic signals can be processed by the electrical circuit via the Fourier transformation calculations such that a point in time of the passage through the layer to be etched is identified.

12. An apparatus for monitoring layer erosion of layers on at least one substrate in a dry-etching process, having a first electrode that electrically contacts the substrate to be etched and a second electrode that is located above the first electrode, both electrodes being situated inside a process chamber, an optical photometer being outside of the process chamber and reflecting a light beam off of the substrate in the process chamber, signals representive of the reflected light beam and output by the optical photometer being amplified and being edited and displayed by means of a Fourier transformation, the optical photometer having at least one measuring light source for producing the light beam with an associated receiver for receiving the reflected light beam, and an electrical circuit for processing of the signals from the associated receiver, comprising the measuring light source located outside of the process chamber and above a first glazed, pressuretight opening in the process chamber, the measuring light source directing the light beam onto the substrate which is reflected by the substrate onto the associated receiver, the associated receiver also being located outside of the process chamber, the second electrode located above the substrate having an aperture for the passage of the light beam of the measuring light source.

13. The apparatus according to claim 12, wherein the associated receiver is located above the first opening.

14. The apparatus according to claim 12, wherein the associated receiver is located above a second separate glazed, pressure-tight opening in the process chamber.

* * * * *